(12) United States Patent
Shyue

(10) Patent No.: US 8,410,797 B2
(45) Date of Patent: Apr. 2, 2013

(54) CAPACITIVE SENSOR AND SENSING METHOD

(75) Inventor: Sheng-Wehn Shyue, Hsinchu County (TW)

(73) Assignee: Nuvoton Technology Corporation, Hsinchu (TW)

(*) Notice: Subject to any disclaimer, the term of this patent is extended or adjusted under 35 U.S.C. 154(b) by 334 days.

(21) Appl. No.: 12/977,759

(22) Filed: Dec. 23, 2010

(65) Prior Publication Data

US 2011/0221452 A1 Sep. 15, 2011

(30) Foreign Application Priority Data

Mar. 12, 2010 (TW) .............................. 99107325 A

(51) Int. Cl.
*G01R 27/26* (2006.01)
(52) U.S. Cl. ........................................ 324/678; 324/658
(58) Field of Classification Search .................. 324/658, 324/678
See application file for complete search history.

(56) References Cited

U.S. PATENT DOCUMENTS

| | | |
|---|---|---|
| 6,816,150 B2 | 11/2004 | Casebolt et al. |
| 7,307,485 B1 | 12/2007 | Snyder et al. |
| 7,541,816 B1 | 6/2009 | Liao et al. |
| 2006/0066585 A1 | 3/2006 | Lin |
| 2006/0114241 A1 | 6/2006 | Lin |
| 2006/0114242 A1 | 6/2006 | Lin |
| 2006/0238205 A1 | 10/2006 | Francis |
| 2007/0291009 A1 | 12/2007 | Wright et al. |
| 2008/0007534 A1 | 1/2008 | Peng et al. |
| 2008/0110739 A1 | 5/2008 | Peng et al. |
| 2009/0009194 A1 | 1/2009 | Seguine |
| 2009/0021241 A1 | 1/2009 | Liao et al. |
| 2009/0021268 A1 | 1/2009 | Liao et al. |
| 2009/0021269 A1 | 1/2009 | Liao et al. |
| 2009/0045821 A1 | 2/2009 | Liao et al. |
| 2009/0153152 A1 | 6/2009 | Maharyta et al. |

*Primary Examiner* — Vincent Q Nguyen
(74) *Attorney, Agent, or Firm* — CKC & Partners Co., Ltd.

(57) ABSTRACT

A capacitive sensing method is provided. The capacitive sensing method includes the step of alternately charging/discharging a capacitive sensing electrode of a capacitive sensor for predetermined times under an active mode and charging/discharging the capacitive sensing electrode during a fixed period under a standby mode while an object is not coupled to the capacitive sensing electrode, in which the capacitive sensing electrode has a first capacitance while the object is not coupled to the capacitive sensing electrode. The capacitive sensing method also includes the step of generating a switch signal while the object is coupled to the capacitive sensing electrode under the standby mode such that the capacitive sensing electrode has a second capacitance larger than the first capacitance and the step of switching the standby mode to the active mode according to the switch signal.

20 Claims, 10 Drawing Sheets

CAPACITIVE SENSOR AND SENSING METHOD

RELATED APPLICATIONS

This application claims priority to Taiwan Patent Application Serial Number 99107325, filed Mar. 12, 2010, which is herein incorporated by reference.

BACKGROUND

1. Technical Field

The present disclosure relates to a sensor. More particularly, the present disclosure relates to a capacitive sensor.

2. Description of Related Art

For high technology nowadays, more and more electronic products start to utilize a touch panel as an operational Interface such that the need for touch sensors increases rapidly. The touch sensor almost has been the basis of any key interface. Replacing traditional key interfaces with the touch sensor control interfaces can undoubtedly make the use of operational interfaces more directly and easily.

In addition, a person skilled in the art can substitute the touch sensor control interfaces for mechanical key interfaces required for various applications, such as access control, mobile phone, MP3 player, PC peripheral device, remote controller, etc., and costs required for the products can thus be saved.

In various types of touch sensors, capacitive sensor has been researched and studied by persons skilled in the art and widely applied in many kinds of products. However, although a conventional capacitive sensor in operation may rapidly sense the touch of a user, in fact it has to consume much power after operating for a while, such that the apparatus using the capacitive sensor consumes significant power.

SUMMARY

In accordance with one embodiment of the present invention, a capacitive sensing method is provided. The capacitive sensing method comprises the step of alternately charging/discharging a capacitive sensing electrode of a capacitive sensor for predetermined times under an active mode and charging/discharging the capacitive sensing electrode during a fixed period under a standby mode while an object is not coupled to the capacitive sensing electrode, in which the capacitive sensing electrode has a first capacitance while the object is not coupled to the capacitive sensing electrode. The capacitive sensing method also includes the step of generating a switch signal while the object is coupled to the capacitive sensing electrode under the standby mode such that the capacitive sensing electrode has a second capacitance larger than the first capacitance and the step of switching the standby mode to the active mode according to the switch signal.

In accordance with another embodiment of the present invention, a capacitive sensor is provided. The capacitive sensor comprises at least one capacitive sensing electrode, a current source, a multiplexer, a first charging/discharging control module, a second charging/discharging control module and a controller. The capacitive sensing electrode has a first capacitance while an object is not coupled to the capacitive sensing electrode and has a second capacitance larger than the first capacitance while an object is coupled to the capacitive sensing electrode. The current source is configured for charging the capacitive sensing electrode. The multiplexer is configured for conducting the capacitive sensing electrode and the current source or conducting the capacitive sensing electrode and a ground, such that the capacitive sensing electrode is charged by the current source or discharged to the ground. The first charging/discharging control module is configured for controlling the multiplexer under an active mode so as to charge/discharge the capacitive sensing electrode for predetermined times. The second charging/discharging control module is configured for controlling the multiplexer under a standby mode so as to charge/discharge the capacitive sensing electrode during a fixed period. The controller is configured for alternately controlling the first charging/discharging control module and the second charging/discharging control module under the active mode and the standby mode, such that capacitive sensing electrode is alternately charged/discharged under the active mode and the standby mode.

In accordance with yet another embodiment of the present invention, a capacitive sensor is provided. The capacitive sensor comprises a plurality of capacitive sensing electrodes, a current source, a multiplexer, a first charging/discharging control module, a second charging/discharging control module and a controller. While an object is not coupled to any of the capacitive sensing electrodes, each of the capacitive sensing electrodes has a first capacitance, and while the object is coupled to one of the capacitive sensing electrodes, the coupled capacitive sensing electrode has a second capacitance larger than the first capacitance. The current source is configured for sequentially charging the capacitive sensing electrodes. The multiplexer is configured for sequentially conducting the capacitive sensing electrodes and the current source or conducting the capacitive sensing electrodes and a ground, such that the capacitive sensing electrodes are charged by the current source or discharged to the ground. The first charging/discharging control module is configured for controlling the multiplexer under an active mode so as to sequentially charge/discharge the capacitive sensing electrodes for predetermined times. The second charging/discharging control module is configured for controlling the multiplexer under a standby mode so as to sequentially charge/discharge the capacitive sensing electrodes during a fixed period. The controller is configured for alternately controlling the first charging/discharging control module and the second charging/discharging control module under the active mode and the standby mode, such that capacitive sensing electrodes are sequentially and alternately charge/discharged under the active mode and the standby mode.

It is to be understood that both the foregoing general description and the following detailed description are by examples, and are intended to provide further explanation of the invention as claimed.

BRIEF DESCRIPTION OF THE DRAWINGS

The disclosure can be more fully understood by reading the following detailed description of the embodiments, with reference to the accompanying drawings as follows.

DESCRIPTION OF THE EMBODIMENTS

In the following description, several specific details are presented to provide a thorough understanding of the embodiments of the present invention. One skilled in the relevant art will recognize, however, that the present invention can be practiced without one or more of the specific details, or in combination with or with other components, etc. In other instances, well-known implementations or operations are not shown or described in detail to avoid obscuring aspects of various embodiments of the present invention.

The terms used in this specification generally have their ordinary meanings in the art and in the specific context where each term is used. The use of examples anywhere in this specification, including examples of any terms discussed herein, is illustrative only, and in no way limits the scope and meaning of the invention or of any exemplified term. Likewise, the present invention is not limited to various embodiments given in this specification.

As used herein, the terms "comprising," "including," "having," "containing," "involving," and the like are to be understood to be open-ended, i.e., to mean including but not limited to.

Reference throughout the specification to "one embodiment" or "an embodiment" means that a particular feature, structure, implementation, or characteristic described in connection with the embodiment is included in at least one embodiment of the present invention. Thus, uses of the phrases "in one embodiment" or "in an embodiment" in various places throughout the specification are not necessarily all referring to the same embodiment. Furthermore, the particular features, structures, implementation, or characteristics may be combined in any suitable manner in one or more embodiments.

Figure 1:
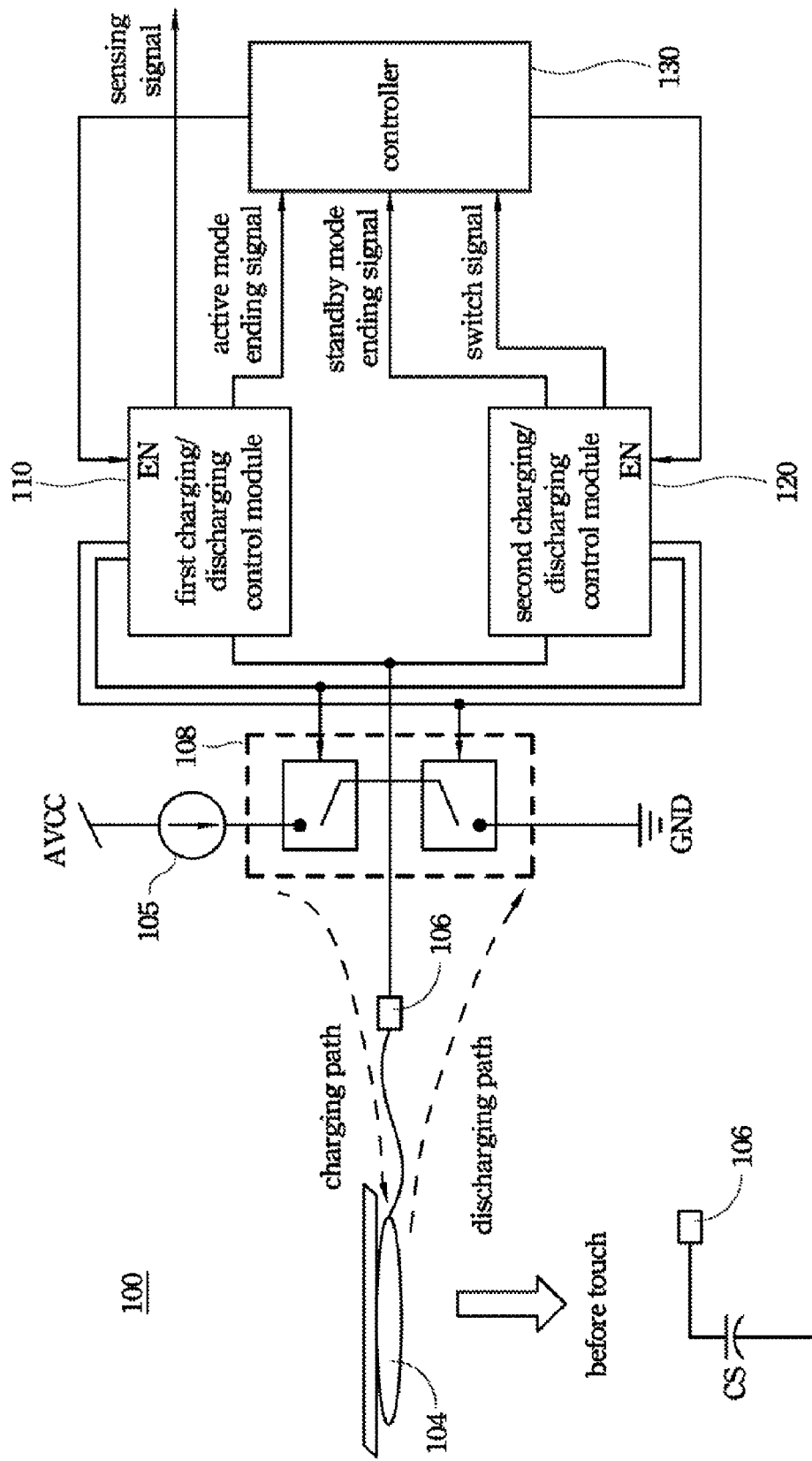
FIG. 1 is a diagram illustrating a capacitive sensor in accordance with one embodiment of the present invention.

FIG. 1 is a diagram illustrating a capacitive sensor in accordance with one embodiment of the present invention. The capacitive sensor 100 includes a capacitive sensing electrode 104 (referred to simply hereinafter as sensing electrode), a current source 105, a multiplexer 108, a first charging/discharging control module 110, a second charging/discharging control module 120 and a controller 130. The current source 105, the multiplexer 108, the first charging/discharging control module 110 the second charging/discharging control module 120 and the controller 130 may be fabricated in one integrated circuit (IC), and the sensing electrode 104 is coupled to a sensing pin 106 of the integrated circuit and charged/discharged by the integrated circuit. Furthermore, the current source 105 may be a constant current source, a combination of voltage source(s) and resistor(s), or even a combination of voltage source(s) and transistor(s); that is, any circuit for generating the current can be applied for the current source 105, which is not limited to any specific type.

Figure 2:
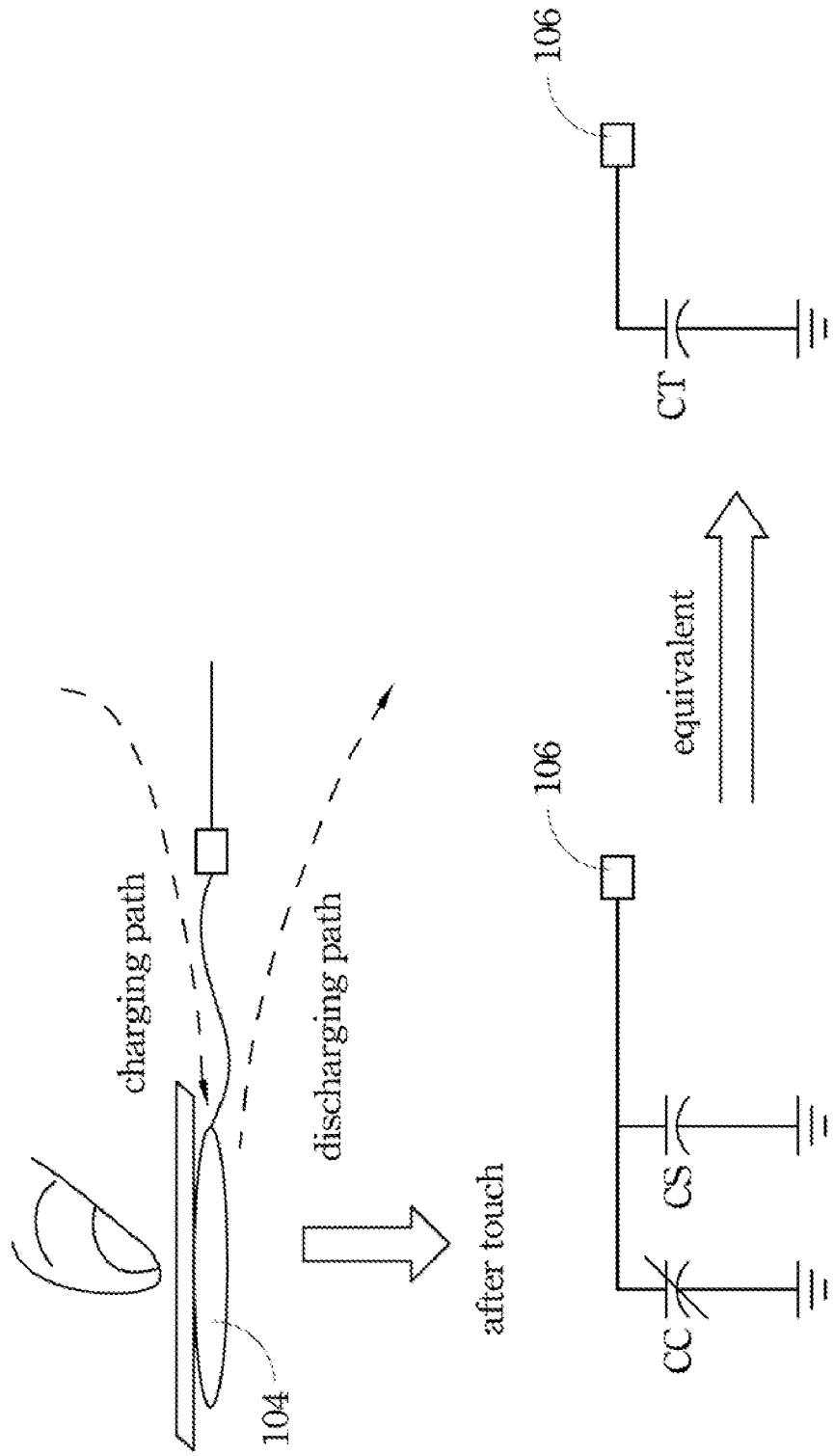
FIG. 2 is a diagram illustrating the sensing electrode shown in FIG. 1, having an equivalent capacitance when touched.

FIG. 2 is a diagram illustrating the sensing electrode shown in FIG. 1, having an equivalent capacitance when touched. Refer to FIG. 1 and FIG. 2. The sensing electrode 104 itself has an equivalent capacitance. For example, while an object (e.g. finger) is not coupled to or not touching the sensing electrode 104, the sensing electrode 104 has a first capacitance CS, and while the object (e.g. finger) is coupled to or touching the sensing electrode 104, the sensing electrode 104 further has an additional coupling capacitance CC due to the coupling effect such that the sensing electrode 104 has a second capacitance CT larger than the first capacitance CS, in which the second capacitance CT is a sum of the first capacitance CS and the coupling capacitance CC.

As shown in FIG. 1, the current source 105 can provide a current for the sensing electrode 104 so as to charge the sensing electrode 104. The multiplexer 108 can be electrically connected with the sensing electrode 104, the current source 105 and a ground GND, for conducting the sensing electrode 104 and the current source 105 or conducting the sensing electrode 104 and the ground GND, such that the sensing electrode 104 is charged by the current source 105 or discharged by the ground GND. More specifically, the multiplexer 108 may be arranged among the sensing electrode 104, the current source 105 and the ground GND.

The first charging/discharging control module 110 can be configured for controlling the multiplexer 108 under an active mode, such that the multiplexer 108 switches to conduct the sensing electrode 104 and the current source 105 or conduct the sensing electrode 104 and the ground GND, so as to charge/discharge the sensing electrode 104 for predetermined times. The second charging/discharging control module 120 can be configured for controlling the multiplexer 108 under a standby mode, such that the multiplexer 108 switches to conduct the sensing electrode 104 and the current source 105 or conduct the sensing electrode 104 and the ground GND, so as to charge/discharge the sensing electrode 104 during a fixed period.

The controller 130 can be configured for alternately controlling the first charging/discharging control module 110 and the second charging/discharging control module 120 under the active mode and the standby mode, such that sensing electrode 104 is alternately charged/discharged under the active mode and the standby mode. The foregoing alternate operation includes at least two conditions, in which one condition is that the capacitive sensor 100 continues to operate under the active mode while used by the user and switches between the active mode and the standby mode over and over during some fixed period while not used by the user (e.g. user does not touch the capacitive sensor 100 in a predetermined time duration); the other condition is that the capacitive sensor 100 operates under the active mode while used by the user and switches to operate under the standby mode while not used by the user (e.g. the capacitive sensor 100 continues to operate under the standby mode, and then switches when touched by the user).

In one embodiment, when the capacitive sensor 100 is to switch to operate under the standby mode, the first charging/discharging control module 110 may transmit an active mode ending signal to the controller 130, so as to inform the controller 130 of activating the second charging/discharging control module 120; on the other hand, when the capacitive sensor 100 is to switch to operate under the active mode, the second charging/discharging control module 120 may transmit a standby mode ending signal to the controller 130, so as to inform the controller 130 of activating the first charging/discharging control module 110.

Figure 3:
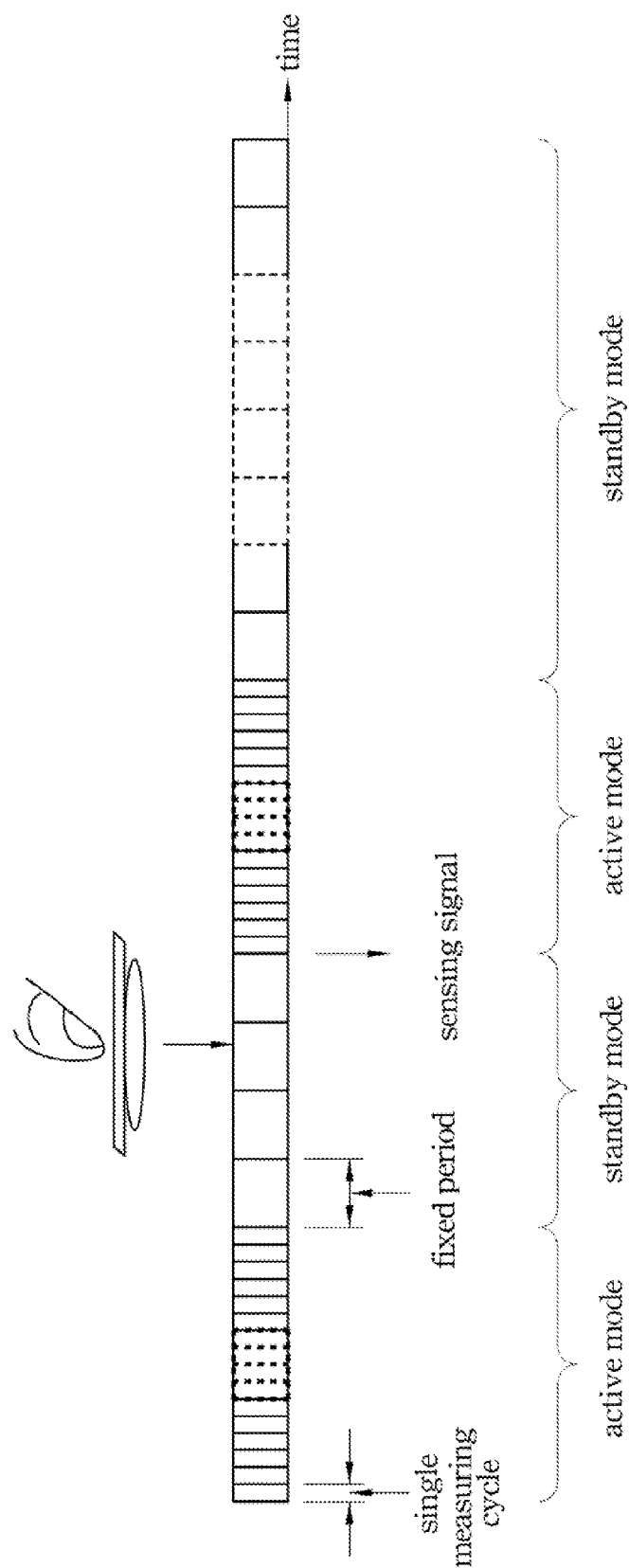
FIG. 3 is a diagram illustrating the capacitive sensor as shown in FIG. 1, operating alternately under the active mode and the standby mode.

FIG. 3 is a diagram illustrating the capacitive sensor as shown in FIG. 1, operating alternately under the active mode and the standby mode. As shown in FIG. 3, the sensing electrode 104 is periodically charged/discharged under the active mode, then is periodically charged/discharged under the standby mode, and yet is periodically charged/discharged under the active mode, and so on.

Then, when the sensing electrode 104 is touched under the standby mode, the second charging/discharging control module 120 sends a switch signal to the controller 130. The controller 130 deactivates the second charging/discharging control module 120 in accordance with the switch signal and activates the first charging/discharging control module 110, such that the capacitive sensor 100 thus switches to operate under the active mode and the sensing electrode 104 is charged/discharged for the predetermined times under the active mode by the first charging/discharging control module 110.

For the sensing manner of periodically charging/discharging the sensing electrode 104 under the active mode shown in FIG. 3, the sensing electrode 104 is charged/discharged for the predetermined times in each measuring cycle, and the operation of the sensing electrode 104 being charged/discharged for the predetermined times under the active mode is continuously performed under the active mode. The operation of the sensing electrode 104 being charged/discharged for the predetermined times under the active mode will be described with embodiments as follows.

Figure 4:
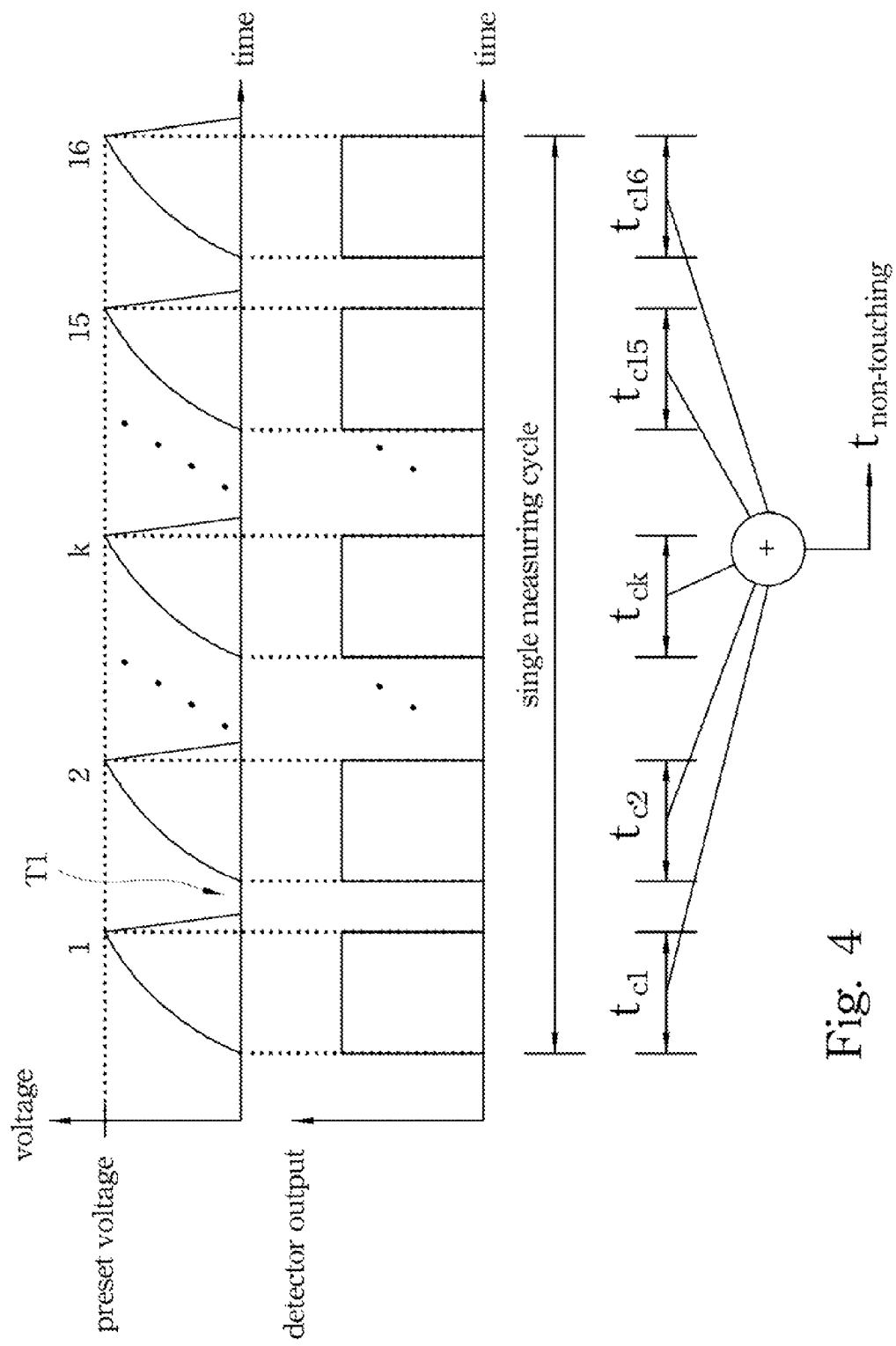
FIG. 4 is a diagram illustrating the voltage variation of the sensing electrode shown in FIG. 1, and the corresponding output signal, while the sensing electrode is charged/discharged under the active mode within one measuring cycle in the condition of the object being not coupled to the sensing electrode, according to one embodiment of the present invention.

FIG. 4 is a diagram illustrating the voltage variation of the sensing electrode shown in FIG. 1, and the corresponding output signal, while the sensing electrode is charged/discharged under the active mode within one measuring cycle in the condition of the object being not coupled to the sensing electrode, according to one embodiment of the present invention. Refer to FIG. 1 and FIG. 4. Under the active mode, while the object is not coupled to the sensing electrode 104, the sensing electrode 104 has the first capacitance CS, and the multiplexer 108 can be controlled by the first charging/discharging control module 110 to switch, such that the sensing electrode 104 is charged by the current source 105 or discharged by the ground GND, in which the sensing electrode 104 may be charged by the current source 105 to a preset voltage level (value of the preset voltage level is known by persons skilled in the art) and then discharged through the ground GND to a zero voltage level. Afterwards, when the sensing electrode 104 is discharged to the zero voltage level, a determined duration T1 first waits until the discharge operation is completed (e.g. 800 ns; T1 may significantly vary with different devices and will do whenever the discharge operation is completed), then the sensing electrode 104 is re-charged by the current source 105 and re-discharged by the ground GND, and this charging and discharging procedure continues for a predetermined times (e.g. 16 times). After that, the foregoing required durations (e.g. $t_{C1}, t_{C2}, t_{C3}, \ldots$) are summed to obtain a total charging duration $t_{non\text{-}touching}$ of the sensing electrode 104 in the measuring cycle. On the other hand, a detector (shown in FIG. 7) also can be used to detect the charging process for the sensing electrode 104 and to output the output signal corresponding to the voltage variation of the sensing electrode 104 having the first capacitance CS.

Figure 5:
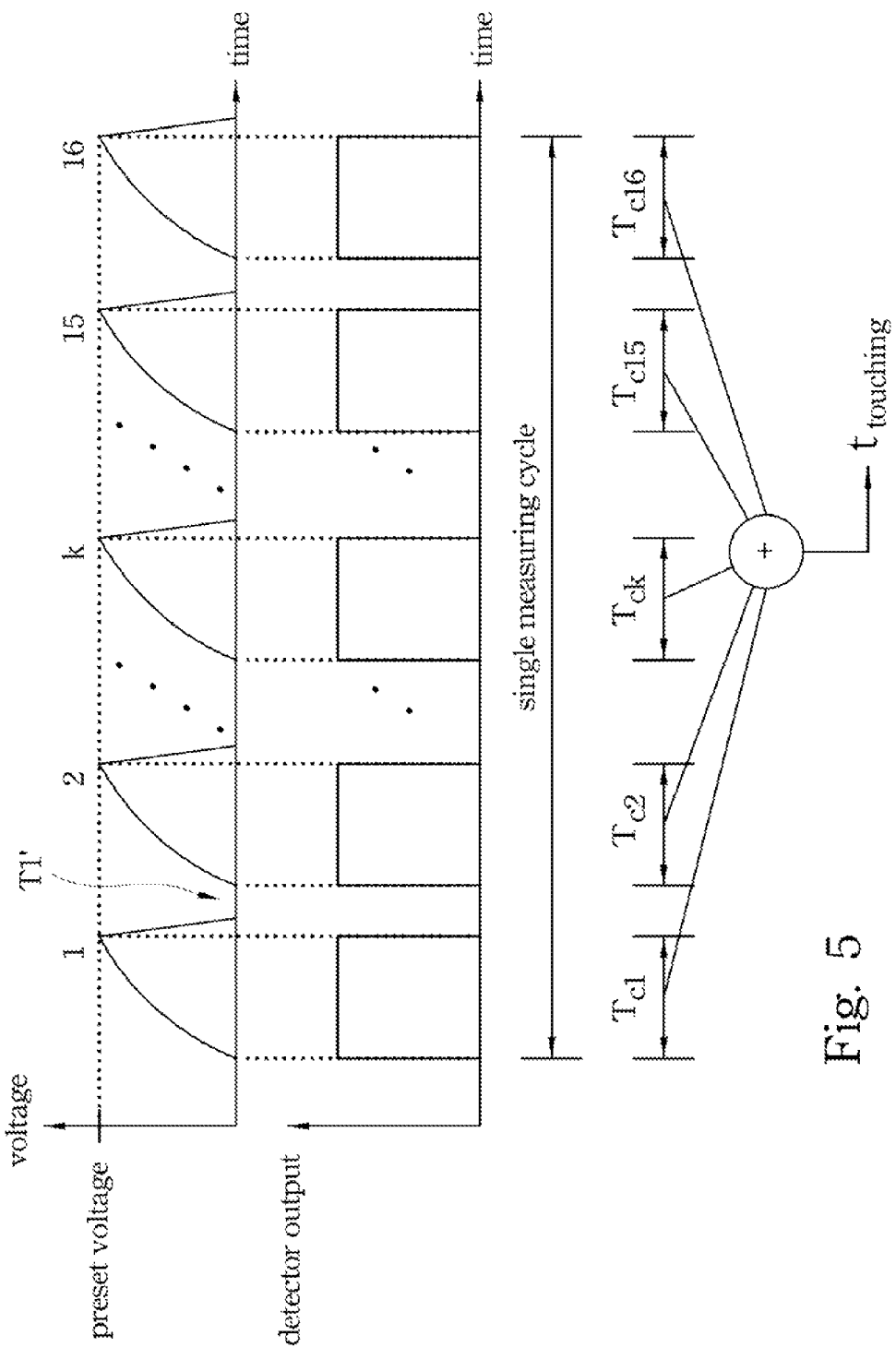
FIG. 5 is a diagram illustrating the voltage variation of the sensing electrode shown in FIG. 1, and the corresponding output signal, while the sensing electrode is charged/discharged within one measuring cycle in the condition of the object being coupled to the sensing electrode, according to one embodiment of the present invention.

FIG. 5 is a diagram illustrating the voltage variation of the sensing electrode shown in FIG. 1, and the corresponding output signal, while the sensing electrode is charged/discharged within one measuring cycle in the condition of the object being coupled to the sensing electrode, according to one embodiment of the present invention. Compared to FIG. 4, the sensing electrode 104 is similarly charged by the current source 105 or discharged through the ground GND, and this charging and discharging procedure continues for the same times (e.g. 16 times). However, since the object is coupled to the sensing electrode 104 at this moment, the sensing electrode 104 has the second capacitance CT which is larger than the first capacitance CS, such that the charging durations (e.g. $T_{C1}, T_{C2}, T_{C3}, \ldots$) required for the sensing electrode 104 based on the above-mentioned charging process would be larger than the charging durations (e.g. $t_{C1}, t_{C2}, t_{C3}, \ldots$) required for the sensing electrode 104 in the condition of the object being not coupled to the sensing electrode 104. Similarly, after the durations (e.g. $T_{C1}, T_{C2}, T_{C3}, \ldots$) required for charging the sensing electrode 104 are acquired, the durations are summed to be a total charging duration $t_{touching}$ of the sensing electrode 104 in the measuring cycle. On the other hand, the detector (shown in FIG. 7) similarly can be used to detect the charging process for the sensing electrode 104 and to output the output signal corresponding to the voltage variation of the sensing electrode 104 having the second capacitance CT.

After the total charging durations $t_{touching}$ and $t_{non\text{-}touching}$ of the sensing electrode 104 in different conditions within one measuring cycle are obtained in accordance with the foregoing manner, the total charging durations $t_{touching}$ and $t_{non\text{-}touching}$ in different conditions are compared with each other, and then a sensing signal is generated in accordance with the comparison of the charging durations, for the following circuits to operate with the sensing signal. As a result, the sensing operation of the object being coupled to the sensing electrode 104 under the active mode can be achieved.

On the other hand, for the sensing manner of performing periodic charging/discharging under the standby mode as shown in FIG. 3, the sensing electrode 104 is charged/discharged during each fixed period. The operation of the sensing electrode 104 being periodically charged/discharged under the standby mode will be described with embodiments as follows.

Figure 6:
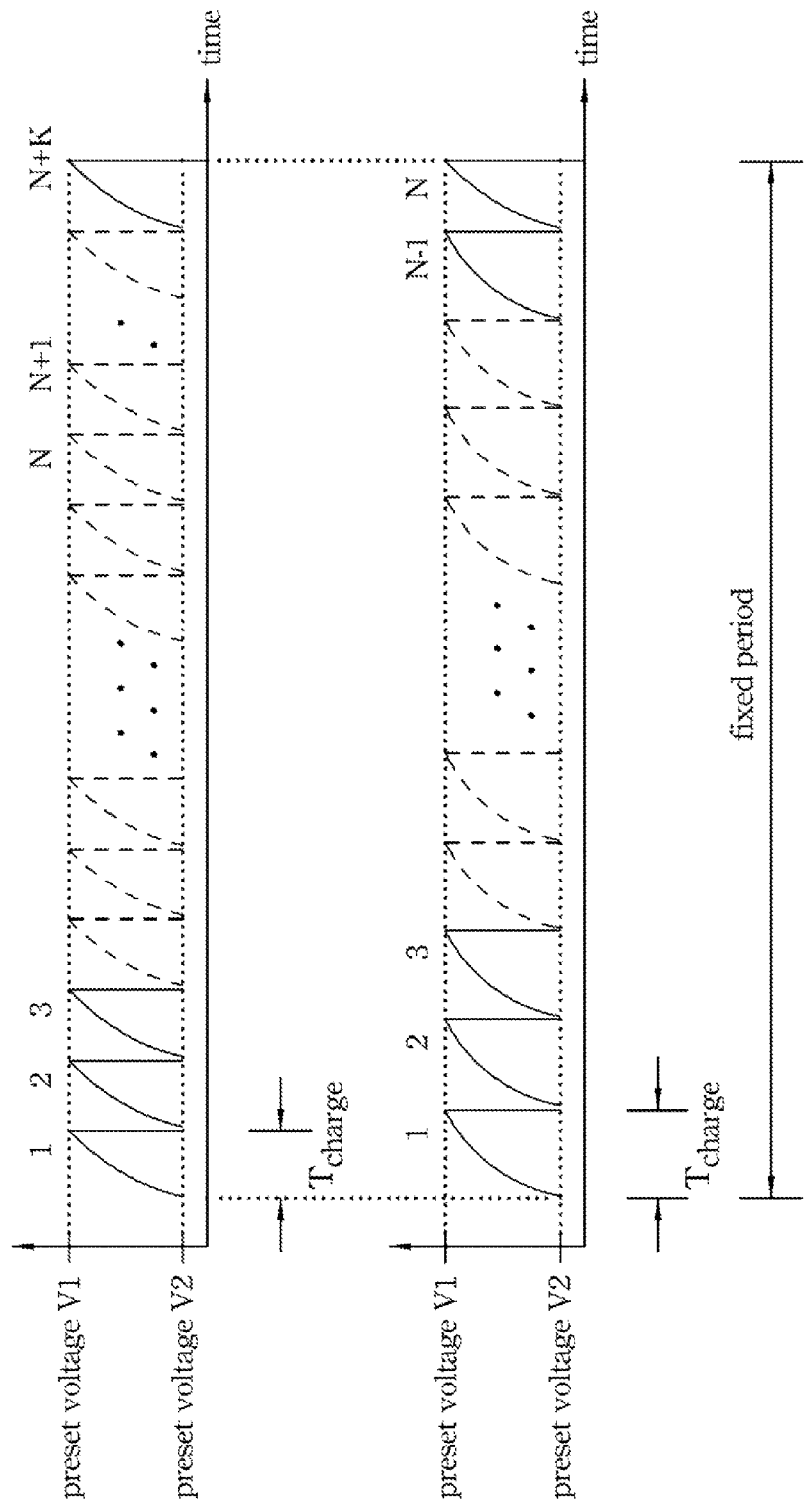
FIG. 6 is a diagram illustrating the voltage variation of the sensing electrode shown in FIG. 1 while the sensing electrode is charged/discharged during the fixed period under the standby mode in the conditions of the object being coupled and not coupled respectively to the sensing electrode according to one embodiment of the present invention.

FIG. 6 is a diagram illustrating the voltage variation of the sensing electrode shown in FIG. 1 while the sensing electrode is charged/discharged during the fixed period under the standby mode in the conditions of the object being coupled and not coupled respectively to the sensing electrode according to one embodiment of the present invention. Refer to FIG. 1 and FIG. 6. Under the standby mode within the fixed period (e.g. 10 ms), while the object is not coupled to the sensing electrode 104, the sensing electrode 104 has the first capacitance CS, and the multiplexer 108 can be controlled by the second charging/discharging control module 120 to switch, such that the sensing electrode 104 can be charged by the current source 105 or discharged by the ground GND. Similarly, the sensing electrode 104 can first be charged by the current source 105 to a preset voltage level V1 and then immediately discharged by the ground GND to another preset voltage level V2. This charging and discharging process is continuously performed for a determined times (e.g. N+K) within the fixed period.

In addition, while the object is coupled to the sensing electrode 104, the sensing electrode 104 has the second capacitance CT, and the multiplexer 108 can similarly be controlled by the second charging/discharging control module 120 to switch, such that the sensing electrode 104 can be charged by the current source 105 or discharged by the ground GND. Notably, since the second capacitance CT is larger than the first capacitance CS, the duration for charging/discharging the sensing electrode 104 increases, such that the times (e.g. N) of charging/discharging the sensing electrode 104 having the second capacitance CT within the fixed period are relatively less than the times (e.g. N+K) of charging/discharging the sensing electrode 104 having first capacitance CS within the fixed period.

After the times of charging (or discharging) the sensing electrode 104 in different conditions within the fixed period are obtained according to the foregoing manner, the times of charging (or discharging) the sensing electrode 104 in different conditions are compared with each other, and then the switch signal is generated in accordance with the comparison of the times, for the controller 130 to accordingly deactivate the second charging/discharging control module 120 and to activate the first charging/discharging control module 110, such that the capacitive sensor 100 thus switches to operate under the active mode and the sensing electrode 104 under the active mode is charged/discharged by the first charging/discharging control module 110 for the predetermined times. As a result, the sensing operation of the object being coupled to the sensing electrode 104 under the standby mode can be achieved.

In conclusion, the capacitive sensor 100 shown in FIG. 1 performs sensing operation alternately under the active mode and the standby mode, in which the sensing electrode 104 would be charged/discharged for the predetermined times within each measuring cycle under the active mode (as shown in FIG. 4) and would be charged/discharged during the fixed period under the standby mode (as shown in FIG. 6). At the moment, if the object is coupled to or touching the sensing electrode 104 under the standby mode, the capacitive sensor 100 will generate the switch signal therein and switch from operating under the standby mode to operating under the active mode in accordance with the switch signal.

Since the capacitive sensor 100 does not always operate under the active mode but operates alternately under the standby mode and the active mode, and further the power consumption required for the capacitive sensor 100 operating under the active mode is usually more than that for the capacitive sensor 100 operating under the standby mode, thus the manner of the capacitive sensor 100 operating alternately under the standby mode and the active mode can save the power consumption for the capacitive sensor 100. In addition, the capacitive sensor 100 is not completely turned off or deactivated under the standby mode but still performs sensing operation simply with lower power consumption (for example, capacitive sensor 100 may employ a low frequency oscillator shown in FIG. 8 to operate under the standby mode), so the capacitive sensor 100 merely needs less time, compared to the prior art, when switching to the normal sensing operation (i.e. the active mode in the embodiments of the present invention). As a result, power saving and rapid sensing operation can be achieved at the same time.

Figure 7:
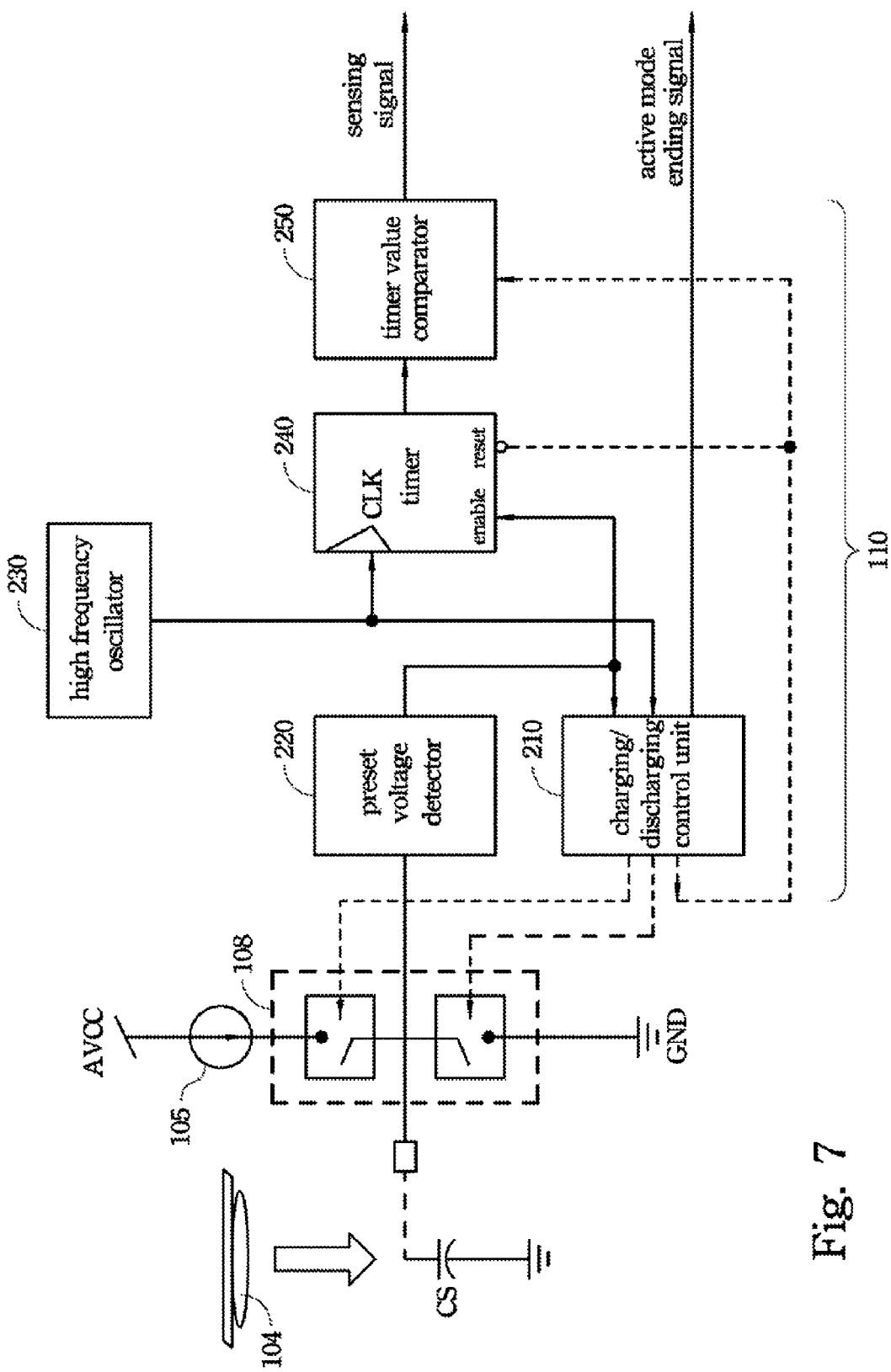
FIG. 7 is a diagram illustrating the first charging/discharging control module shown in FIG. 1 and its operation under the active mode according to one embodiment of the present invention.

FIG. 7 is a diagram illustrating the first charging/discharging control module shown in FIG. 1 and its operation under the active mode according to one embodiment of the present invention. The first charging/discharging control module 110 includes a charging/discharging control unit 210, a preset voltage detector 220, a high frequency oscillator 230, a timer 240 and a timer value comparator 250.

The charging/discharging control unit 210 can be configured for controlling the multiplexer 108, such that the multiplexer 108 conducts the sensing electrode 104 and the current source 105 or conducts the sensing electrode 104 and the ground GND under the standby mode or the active mode. Specifically, in the condition of the object being not coupled to the sensing electrode 104, the multiplexer 108 is controlled by the charging/discharging control unit 210 to conduct the current source 105 and the sensing electrode 104 having the first capacitance CS, or to conduct the ground GND and the sensing electrode 104 having the first capacitance CS, such that the sensing electrode 104 can accordingly perform periodic charging/discharging. On the other hand, in the condition of the object being coupled to the sensing electrode 104, the multiplexer 108 similarly can be controlled by the charging/discharging control unit 210 to conduct the current source 105 and the sensing electrode 104 having the second capacitance CT, or to conduct the ground GND and the sensing electrode 104 having the second capacitance CT, such that the sensing electrode 104 can accordingly perform periodic charging/discharging.

The preset voltage detector 220 can be configured for detecting a voltage of the sensing electrode 140 and driving the charging/discharging control unit 210 while the voltage of the sensing electrode 104 is charged to a preset level so as to control the multiplexer 108 to conduct the sensing electrode 104 and the ground GND, such that the sensing electrode 104 is discharged. The output signal from the preset voltage detector 220 detecting the voltage of the sensing electrode 104 can be shown in FIG. 4 or FIG. 5. In the condition of the object being not coupled to the sensing electrode 104, the preset voltage detector 220 can drive the charging/discharging control unit 210 while the voltage of the sensing electrode 104 having the first capacitance CS is charged to the preset level, such that the ground GND is conducted with the sensing electrode 104 and the sensing electrode 104 is discharged through the ground GND. On the other hand, in the condition of the object being coupled to the sensing electrode 104, the preset voltage detector 220 can drive the charging/discharging control unit 210 while the voltage of the sensing electrode 104 having the second capacitance CT is charged to the preset level, such that the ground GND is conducted with the sensing electrode 104 and the sensing electrode 104 is discharged through the ground GND.

The high frequency oscillator 230 can be configured for generating a high frequency oscillation signal (e.g. 10 MHz oscillation signal) and the high frequency oscillation signal can be used as an operation clock for the charging/discharging control unit 210, in which the charging/discharging control unit 210 may receive the high frequency oscillation signal and control the multiplexer 108 to switch in accordance with the high frequency oscillation signal, for determining the time duration of discharging the sensing electrode 104.

The timer 240 can be configured for receiving the high frequency oscillation signal from the high frequency oscillator 230 and activated by the charging/discharging control unit 210 while the sensing electrode 104 is charged, so as to obtain a duration required for charging the sensing electrode 104 having the first capacitance CS or the second capacitance CT within one measuring cycle (as shown in FIG. 3) in accordance with the high frequency oscillation signal.

The timer value comparator 250 can be configured for comparing the duration required for charging the sensing electrode 104 having the first capacitance CS with the duration required for charging the sensing electrode 104 having the second capacitance CT within the measuring cycle to output the sensing signal, for the following circuits to operate with the sensing signal.

Figure 8:
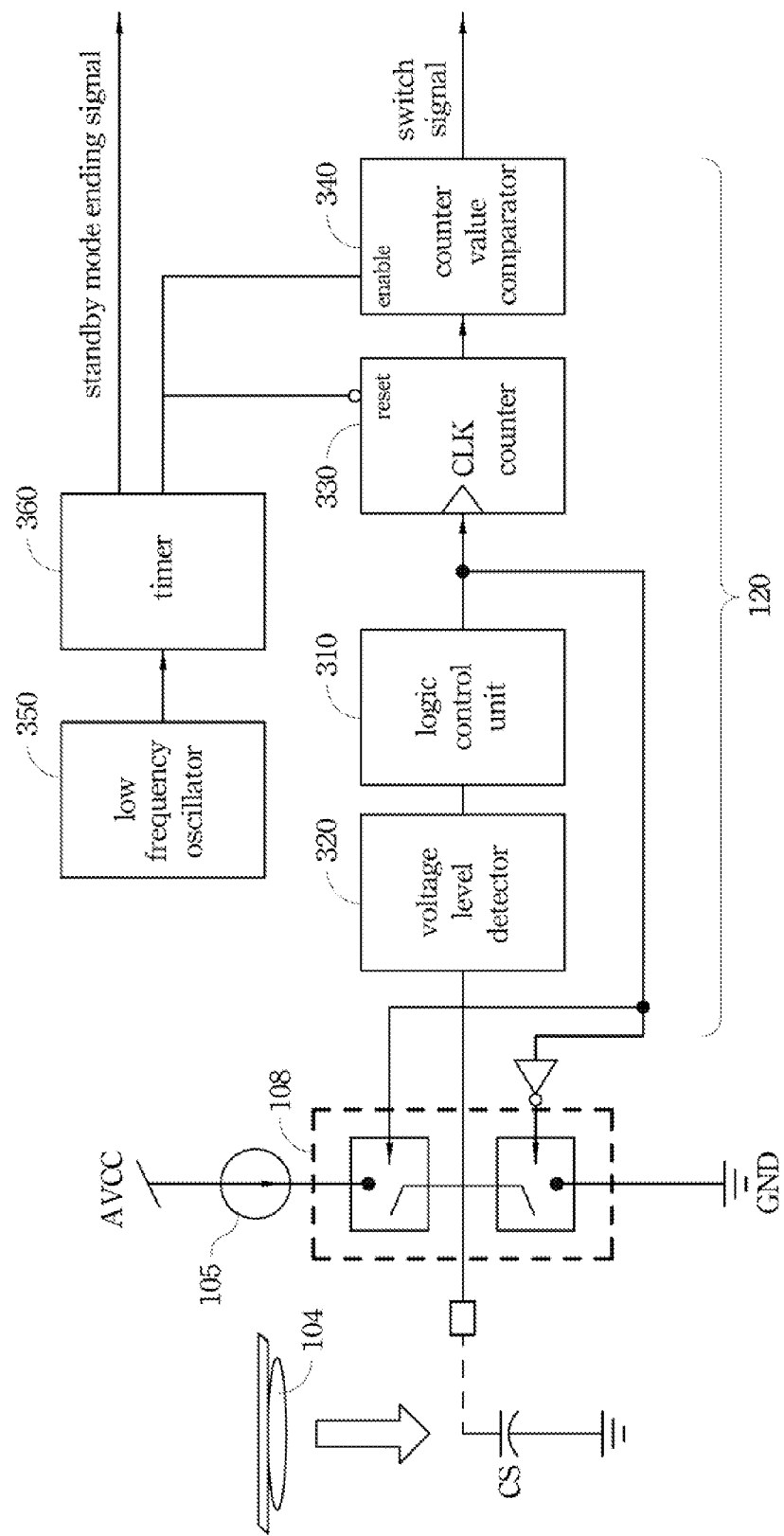
FIG. 8 is a diagram illustrating the second charging/discharging control module shown in FIG. 1 and its operation under the standby mode according to one embodiment of the present invention.

FIG. 8 is a diagram illustrating the second charging/discharging control module shown in FIG. 1 and its operation under the standby mode according to one embodiment of the present invention. The second charging/discharging control module 120 includes a logic control unit 310, a voltage level detector 320, a counter 330, a counter value comparator 340, a low frequency oscillator 350 and a timer 360.

The logic control unit 310 can be configured for outputting a logic control signal to control the multiplexer 108, such that the multiplexer 108 conducts the sensing electrode 104 and the current source 105 or conducts the sensing electrode 104 and the ground GND. In the condition of the object being not coupled to the sensing electrode 104, the multiplexer 108 can be controlled by the logic control unit 310 to conduct the current source 105 and the sensing electrode 104 having the first capacitance CS, or to conduct the ground GND and the sensing electrode 104 having the first capacitance CS, such that the sensing electrode 104 can accordingly perform periodic charging/discharging. On the other hand, in the condition of the object being coupled to the sensing electrode 104, the multiplexer 108 similarly can be controlled by the logic control unit 310 to conduct the current source 105 and the sensing electrode 104 having the second capacitance CT, or to conduct the ground GND and the sensing electrode 104 having the second capacitance CT, such that the sensing electrode 104 can accordingly perform periodic charging/discharging.

The voltage level detector 320 can be configured for detecting the voltage level of the sensing electrode 104, so as to detect the voltage level of the sensing electrode 104 having the first capacitance CS or the second capacitance CT under the standby mode. Furthermore, the voltage level detector 320 may drive the logic control unit 310 while the sensing electrode 104 has a high voltage level to control the multiplexer 108 to conduct the ground GND and the sensing electrode 104, such that the sensing electrode 104 can be discharged through the ground GND. On the other hand, the voltage level detector 320 may also drive the logic control unit 310 while the sensing electrode 104 has a low voltage level to control the multiplexer 108 to conduct the current source 105 and the sensing electrode 104, such that the sensing electrode 104 can be charged by the current source 105.

The counter 330 can be configured for receiving the logic control signal from the logic control unit 310 and accordingly counting the times of charging/discharging the sensing electrode 104. In the condition of the object being not coupled to the sensing electrode 104, the counter 330 can count the times of charging/discharging the sensing electrode 104 having the first capacitance CS within the fixed period. On the other hand, in the condition of the object being coupled to the sensing electrode 104, the counter 330 can count the times of charging/discharging the sensing electrode 104 having the second capacitance CT within the fixed period.

The counter value comparator 340 can be configured for comparing the times of charging/discharging the sensing electrode 104 in the conditions of the object being coupled and not coupled to the sensing electrode 104 to output the switch signal in accordance with the comparison of the times. Specifically, while the counter 330 counts the times of charging/discharging the sensing electrode 104 having the first capacitance CS and counts the times of charging/discharging the sensing electrode 104 having the second capacitance CT respectively in the conditions of the object being coupled and not coupled to the sensing electrode 104, the counter value comparator 340 compares the charging (or discharging) times in both conditions with each other and outputs the switch signal in accordance with the comparison, such that the controller 130 shown in FIG. 1 deactivates the second charging/discharging control module 120 and activates the first charging/discharging control module 110 in accordance with the switch signal.

The low frequency oscillator 350 can be configured for generating a low frequency oscillation signal. The timer can be configured for receiving the low frequency oscillation signal, counting out the fixed period shown in FIG. 3 in accordance with the low frequency oscillation signal, and resetting the counter 330 at the end of the fixed period.

Figure 9:
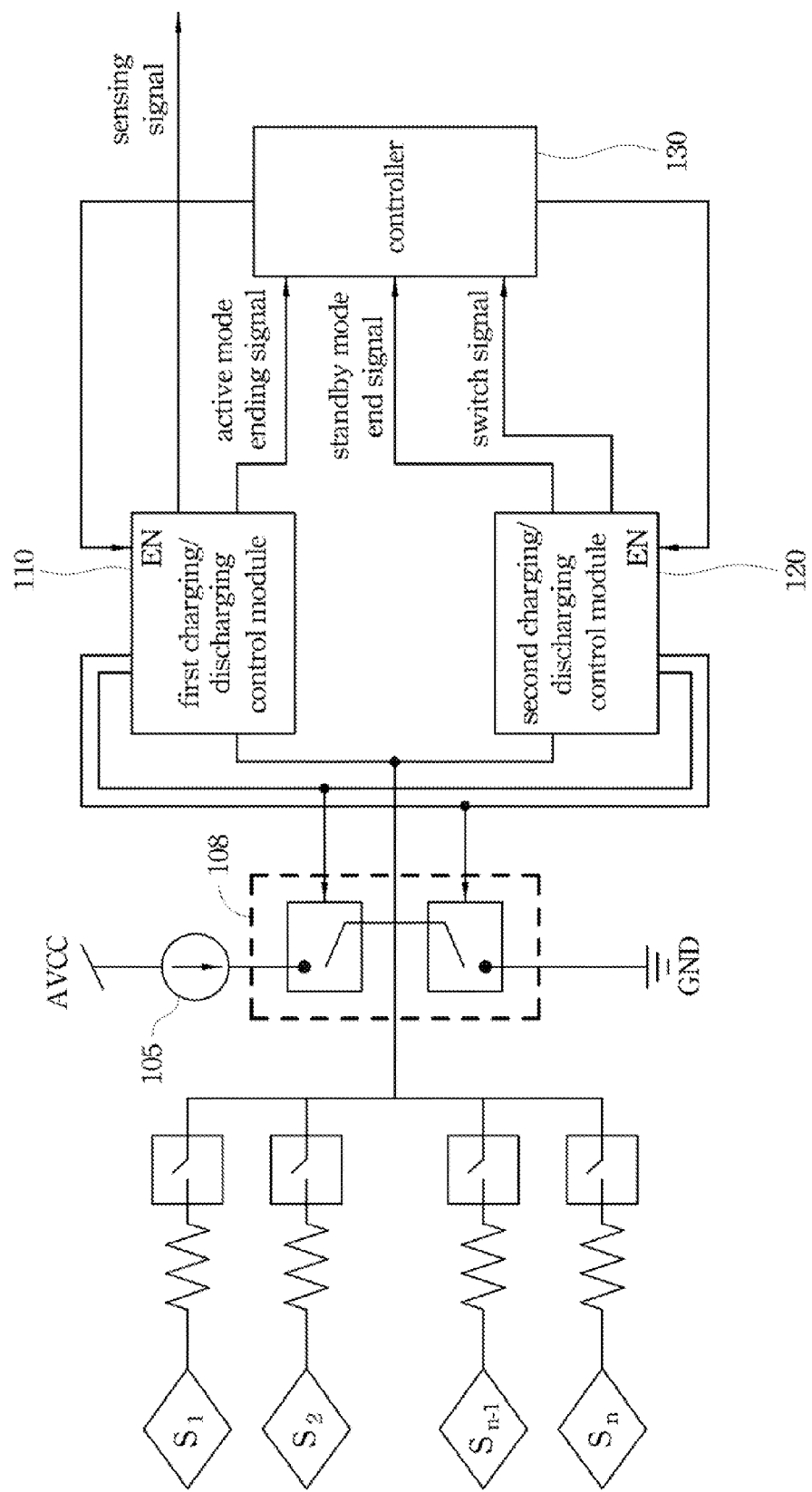
FIG. 9 is a diagram illustrating a capacitive sensor in accordance with another embodiment of the present invention.

FIG. 9 is a diagram illustrating a capacitive sensor in accordance with another embodiment of the present invention. Compared to FIG. 1, the capacitive sensor in the present embodiment similarly include the current source 105, the multiplexer 108, the first charging/discharging control module 110, the second charging/discharging control module 120 and the controller 130, and the capacitive sensor further can sequentially detect several capacitive sensing electrodes $S_1$, $S_2$, ..., $S_n$, such that the capacitive sensor can be in more widespread use.

Specifically, for the sensing electrodes $S_1$, $S_2$, ..., $S_n$, while the object is not coupled to any of the sensing electrodes $S_1$, $S_2$, ..., $S_n$, each sensing electrode has the first capacitance CS; while the object is coupled to one of the sensing electrodes $S_1$, $S_2$, ..., $S_n$, the coupled sensing electrode has the second capacitance CT larger than the first capacitance CS. The current source 105 can be configured for sequentially charging the sensing electrodes $S_1$, $S_2$, ..., $S_n$. The multiplexer 108 can be configured for sequentially conducting the sensing electrodes $S_1$, $S_2$, ..., $S_n$ and the current source 105, or sequentially conducting the sensing electrodes $S_1$, $S_2$, ..., $S_n$ and the ground GND, such that the sensing electrodes $S_1$, $S_2$, ..., $S_n$ can sequentially be charged by the current source 105 or discharged by the ground GND.

The first charging/discharging control module 110 can be configured for controlling the multiplexer 108 under the active mode so as to sequentially charge/discharge the capacitive sensing electrodes $S_1$, $S_2$, ..., $S_n$ for predetermined times. The second charging/discharging control module 120 can be configured for controlling the multiplexer 108 under the standby mode so as to sequentially charge/discharge the capacitive sensing electrodes $S_1$, $S_2$, ..., $S_n$ during a fixed period.

The controller 130 can be configured for alternately controlling the first charging/discharging control module 110 and the second charging/discharging control module 120 under the active mode and the standby mode, such that capacitive sensing electrodes $S_1$, $S_2$, ..., $S_n$ are sequentially and alternately charged/discharged under the active mode and the standby mode. In other words, after the capacitive sensing electrodes $S_1$, $S_2$, ..., $S_n$ are sequentially charged/discharged under the active mode, the capacitive sensor switches such that the capacitive sensing electrodes $S_1$, $S_2$, ..., $S_n$ are sequentially charged/discharged under the standby mode, and then the capacitive sensor switches back such that the capacitive sensing electrodes $S_1$, $S_2$, ..., $S_n$ are sequentially charged/discharged under the active mode, and so on. Moreover, the capacitive sensor in the present embodiment can still include a synchronization controller (not shown), in which the synchronization controller can be configured for controlling the first charging/discharging control module 110 and the second charging/discharging control module 120, such that the first charging/discharging control module 110 and the second charging/discharging control module 120 can be controlled to perform charging/discharging operation to the corresponding sensing electrode.

Figure 10:
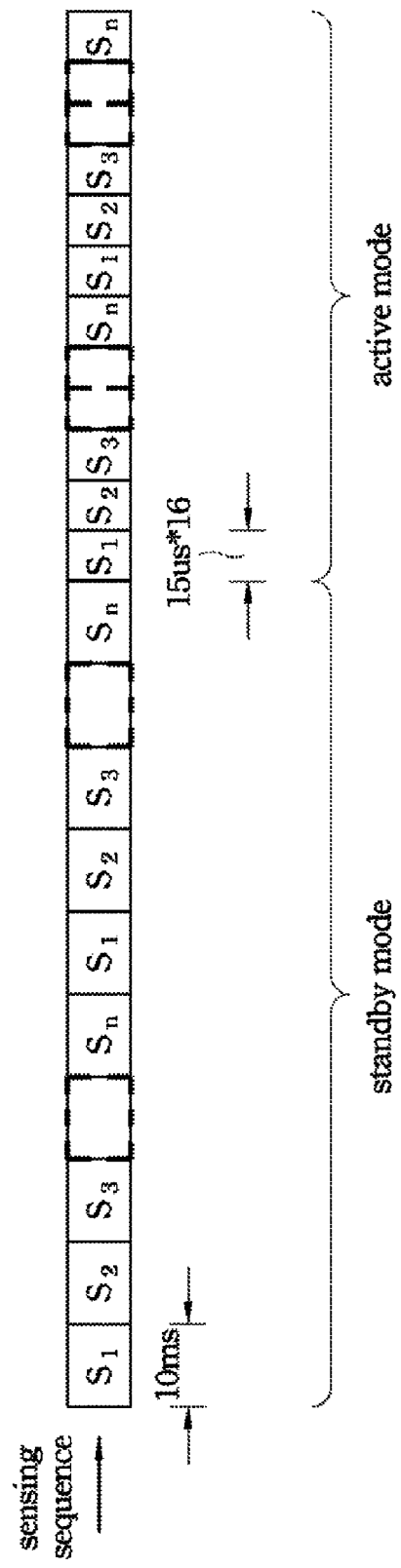
FIG. 10 is a diagram illustrating the capacitive sensor as shown in FIG. 9, detecting sequentially the sensing electrodes alternately under the active mode and the standby mode.

FIG. 10 is a diagram illustrating the capacitive sensor as shown in FIG. 9, detecting sequentially the sensing electrodes alternately under the active mode and the standby mode. As shown in FIG. 10, the capacitive sensor sequentially detects the sensing electrodes $S_1, S_2, \ldots, S_n$ alternately under the active mode and the standby mode.

Notably, in order to solve the problem of power consumption in prior art, the capacitive sensor switches to operate under the power-off mode or temporarily deactivates the capacitive sensor, and then the capacitive sensor is awakened by an outside microprocessor when it is necessary to perform the touching sensing operation, so as to save the power consumption.

However, for the foregoing prior art, the capacitive sensor is completely turned off or deactivated, so it still takes a time duration for the capacitive sensor to switch back to the normal operation, such that the capacitive sensor cannot be rapidly and effectively operated for the user to perform touching and sensing.

Therefore, since the embodiments of the present invention employ the manner of performing sensing operation alternately under the active mode and the standby mode, and since the capacitive sensor is not completely turned off or deactivated under the standby mode but still performs sensing operation simply with lower power consumption, the capacitive sensor merely needs less time, compared to the prior art, when switching back to the normal sensing operation (i.e. the active mode in the embodiments of the present invention). As a result, power saving and rapid sensing operation can be achieved at the same time.

As is understood by a person skilled in the art, the foregoing embodiments of the present invention are illustrative of the present invention rather than limiting of the present invention. It is intended to cover various modifications and similar arrangements included within the spirit and scope of the appended claims, the scope of which should be accorded with the broadest interpretation so as to encompass all such modifications and similar structures.

What is claimed is:

1. A capacitive sensing method, comprising:
   alternately charging/discharging a capacitive sensing electrode of a capacitive sensor for predetermined times under an active mode and charging/discharging the capacitive sensing electrode during a fixed period under a standby mode while an object is not coupled to the capacitive sensing electrode, wherein the capacitive sensing electrode has a first capacitance while the object is not coupled to the capacitive sensing electrode;
   generating a switch signal while the object is coupled to the capacitive sensing electrode under the standby mode such that the capacitive sensing electrode has a second capacitance larger than the first capacitance; and
   switching the standby mode to the active mode according to the switch signal.

2. The capacitive sensing method as claimed in claim 1, further comprising:
   charging/discharging the capacitive sensing electrode for the predetermined times under the active mode after the standby mode being switched to the active mode according to the switch signal;
   comparing charging duration of the capacitive sensing electrode having the first capacitance with charging duration of the capacitive sensing electrode having the second capacitance under the active mode; and
   generating a sensing signal in accordance with the comparison of the charging durations.

3. The capacitive sensing method as claimed in claim 2, wherein the step of charging/discharging the capacitive sensing electrode under the active mode further comprises:
   charging the capacitive sensing electrode to a preset voltage level;
   discharging the capacitive sensing electrode to a zero voltage level while the capacitive sensing electrode is charged to the preset voltage level; and
   waiting for a predetermined duration while the capacitive sensing electrode is discharged to the zero voltage level and re-charging and re-discharging the capacitive sensing electrode.

4. The capacitive sensing method as claimed in claim 2, further comprising:
   obtaining the charging duration of the capacitive sensing electrode having the first capacitance in accordance with the charging of the capacitive sensing electrode having the first capacitance for the predetermined times while the object is not coupled to the capacitive sensing electrode under the active mode.

5. The capacitive sensing method as claimed in claim 4, further comprising:
   charging/discharging the capacitive sensing electrode having the second capacitance for the predetermined times while the object is coupled to the capacitive sensing electrode under the active mode such that the capacitive sensing electrode has the second capacitance; and
   obtaining the charging duration of the capacitive sensing electrode having the second capacitance in accordance with the charging of the capacitive sensing electrode having the second capacitance for the predetermined times.

6. The capacitive sensing method as claimed in claim 5, wherein the step of charging/discharging the capacitive sensing electrode under the active mode while the object is coupled to the capacitive sensing electrode further comprises:
   charging the capacitive sensing electrode to a preset voltage level;
   discharging the capacitive sensing electrode to a zero voltage level while the capacitive sensing electrode is charged to the preset voltage level; and
   waiting for a predetermined duration while the capacitive sensing electrode is discharged to the zero voltage level and re-charging and re-discharging the capacitive sensing electrode.

7. The capacitive sensing method as claimed in claim 1, further comprising:
   charging/discharging the capacitive sensing electrode having the second capacitance during the fixed period while the object is coupled to the capacitive sensing electrode under the standby mode such that the capacitive sensing electrode has the second capacitance.

8. The capacitive sensing method as claimed in claim 7, wherein under the standby mode within the fixed period, times of charging/discharging the capacitive sensing electrode not coupled to the object are larger than times of charging/discharging the capacitive sensing electrode coupled to the object.

9. The capacitive sensing method as claimed in claim 7, further comprising:
   under the standby mode within the fixed period, comparing times of charging/discharging the capacitive sensing electrode not coupled to the object with times of charging/discharging the capacitive sensing electrode coupled to the object; and generating the switch signal in accordance with the comparison of the times of charging/discharging the capacitive sensing electrode during the fixed period in the condition of the object being coupled and not coupled to the capacitive sensing electrode.

10. A capacitive sensor, comprising:

at least one capacitive sensing electrode, the capacitive sensing electrode having a first capacitance while an object is not coupled to the capacitive sensing electrode, the capacitive sensing electrode having a second capacitance larger than the first capacitance while an object is coupled to the capacitive sensing electrode;

a current source for charging the capacitive sensing electrode;

a multiplexer for conducting the capacitive sensing electrode and the current source or conducting the capacitive sensing electrode and a ground, such that the capacitive sensing electrode is charged by the current source or discharged to the ground;

a first charging/discharging control module for controlling the multiplexer under an active mode so as to charge/discharge the capacitive sensing electrode for predetermined times;

a second charging/discharging control module for controlling the multiplexer under a standby mode so as to charge/discharge the capacitive sensing electrode during a fixed period; and a controller for alternately controlling the first charging/discharging control module and the second charging/discharging control module under the active mode and the standby mode, such that capacitive sensing electrode is alternately charged/discharged under the active mode and the standby mode.

11. The capacitive sensor as claimed in claim 10, wherein while the object is coupled to the capacitive sensing electrode under the standby mode such that the capacitive sensing electrode has the second capacitance, the second charging/discharging control module generates a switch signal, the controller deactivates the second charging/discharging control module and activates the first charging/discharging control module in accordance with the switch signal such that the capacitive sensing electrode having the second capacitance is charged/discharged for the predetermined times under the active mode.

12. The capacitive sensor as claimed in claim 11, wherein the first charging/discharging control module further comprises:

a charging/discharging control unit for controlling the multiplexer to conduct the capacitive sensing electrode and the current source or to conduct the capacitive sensing electrode and the ground; and a preset voltage detector for detecting a voltage of the capacitive sensing electrode and driving the charging/discharging control unit while the voltage of the capacitive sensing electrode is charged to a preset level so as to control the multiplexer to conduct the capacitive sensing electrode and the ground.

13. The capacitive sensor as claimed in claim 12, wherein the first charging/discharging control module further comprises:

a high frequency oscillator for generating a high frequency oscillation signal as an operation clock for the charging/discharging control unit, the charging/discharging control unit receiving the high frequency oscillation signal and controlling the multiplexer in accordance with the high frequency oscillation signal to determine a duration of discharging the capacitive sensing electrode.

14. The capacitive sensor as claimed in claim 13, wherein the first charging/discharging control module further comprises:

a first timer for receiving the high frequency oscillation signal and activated by the charging/discharging control unit while the capacitive sensing electrode is charged so as to obtain a duration required for charging the capacitive sensing electrode having the first capacitance or the second capacitance within a measuring cycle in accordance with the high frequency oscillation signal.

15. The capacitive sensor as claimed in claim 14, wherein the first charging/discharging control module further comprises:

a timer value comparator for comparing the duration required for charging the capacitive sensing electrode having the first capacitance with the duration required for charging the capacitive sensing electrode having the second capacitance within the measuring cycle to output a sensing signal.

16. The capacitive sensor as claimed in claim 10, wherein the second charging/discharging control module further comprises:

a logic control unit for outputting a logic control signal to control the multiplexer to conduct the capacitive sensing electrode and the current source or to conduct the capacitive sensing electrode and the ground; and a voltage level detector for detecting a voltage level of the capacitive sensing electrode, the voltage level detector driving the logic control unit while the capacitive sensing electrode has a high voltage level to control the multiplexer to conduct the capacitive sensing electrode and the ground and driving the logic control unit while the capacitive sensing electrode has a low voltage level to control the multiplexer to conduct the capacitive sensing electrode and the current source.

17. The capacitive sensor as claimed in claim 16, wherein the second charging/discharging control module further comprises:

a counter for receiving the logic control signal and counting times of charging/discharging the capacitive sensing electrode having the first capacitance and the second capacitance respectively in accordance with the logic control signal within the fixed period.

18. The capacitive sensor as claimed in claim 17, wherein the second charging/discharging control module further comprises:

a counter value comparator for comparing the times of charging/discharging the capacitive sensing electrode having the first capacitance with the times of charging/discharging the capacitive sensing electrode having the second capacitance to output the switch signal.

19. The capacitive sensor as claimed in claim 18, wherein the second charging/discharging control module further comprises:

a low frequency oscillator for generating a low frequency oscillation signal; and a second timer for receiving the low frequency oscillation signal and counting out the fixed period in accordance with the low frequency oscillation signal, the second timer resetting the counter at the end of the fixed period.

20. A capacitive sensor, comprising:
a plurality of capacitive sensing electrodes, wherein while an object is not coupled to any of the capacitive sensing electrodes, each of the capacitive sensing electrodes has a first capacitance, and while the object is coupled to one of the capacitive sensing electrodes, the coupled capacitive sensing electrode has a second capacitance larger than the first capacitance;
a current source for sequentially charging the capacitive sensing electrodes;
a multiplexer for sequentially conducting the capacitive sensing electrodes and the current source or conducting the capacitive sensing electrodes and a ground, such that the capacitive sensing electrodes are charged by the current source or discharged to the ground;
a first charging/discharging control module for controlling the multiplexer under an active mode so as to sequentially charge/discharge the capacitive sensing electrodes for predetermined times;
a second charging/discharging control module for controlling the multiplexer under a standby mode so as to sequentially charge/discharge the capacitive sensing electrodes during a fixed period; and
a controller for alternately controlling the first charging/discharging control module and the second charging/discharging control module under the active mode and the standby mode, such that capacitive sensing electrodes are sequentially and alternately charged/discharged under the active mode and the standby mode.

* * * * *